United States Patent
Ishii et al.

(10) Patent No.: US 7,557,049 B2
(45) Date of Patent: Jul. 7, 2009

(54) PRODUCING METHOD OF WIRED CIRCUIT BOARD

(75) Inventors: Jun Ishii, Osaka (JP); Yasunari Ooyabu, Osaka (JP); Hiroyuki Kurai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/976,234

(22) Filed: Oct. 23, 2007

(65) Prior Publication Data

US 2008/0102608 A1   May 1, 2008

Related U.S. Application Data

(60) Provisional application No. 60/907,024, filed on Mar. 16, 2007.

(30) Foreign Application Priority Data

Oct. 30, 2006   (JP)   ............................. 2006-294620

(51) Int. Cl.
   *H01L 21/31*   (2006.01)
(52) U.S. Cl. ........................ 438/780; 438/290; 438/578; 438/729; 257/E51.021; 257/E51.019; 257/E51.008
(58) Field of Classification Search ................. 438/599, 438/99, 780, 729, 290, 578
   See application file for complete search history.

(56) References Cited

U.S. PATENT DOCUMENTS

| 4,628,726 | A | * | 12/1986 | Heikkila et al. | ............. | 73/61.53 |
| 5,510,014 | A | * | 4/1996 | Murayama | ................... | 205/101 |
| 5,786,986 | A | * | 7/1998 | Bregman et al. | ............ | 361/719 |
| 6,873,518 | B2 | | 3/2005 | Masuda et al. | | |
| 2003/0059975 | A1 | * | 3/2003 | Sirringhaus et al. | ........... | 438/99 |
| 2003/0151902 | A1 | | 8/2003 | Kageyama et al. | | |
| 2005/0045486 | A1 | * | 3/2005 | Sahoda et al. | ............... | 205/123 |
| 2008/0210569 | A1 | * | 9/2008 | Dahms et al. | ................ | 205/296 |

FOREIGN PATENT DOCUMENTS

| JP | 2004-158480 | | 6/2004 |
| JP | 2004/158480 | * | 6/2004 |

\* cited by examiner

*Primary Examiner*—William M. Brewster
*Assistant Examiner*—Wilner Jean Baptiste
(74) *Attorney, Agent, or Firm*—Jean C. Edwards, Esq.; Akerman Senterfitt

(57) ABSTRACT

A producing method of a wired circuit board includes the step of preparing a wired circuit board including an insulating layer and a conductive pattern having a wire covered with the insulating layer and a terminal portion exposed from the insulating layer; and the step of forming a semiconductive layer on a surface of the insulating layer by dipping the wired circuit board in a polymeric liquid of a conductive polymer in which an electrode is provided, and applying a voltage so that the electrode becomes an anode and the conductive pattern becomes a cathode.

5 Claims, 6 Drawing Sheets

(a)

(b)

(c)

(d)

PRODUCING METHOD OF WIRED CIRCUIT BOARD

CROSS-REFERENCE TO RELATED APPLICATION

This patent application claims the benefit of U.S. Provisional Application No. 60/907,024, filed on Mar. 16, 2007, and claims priority from Japanese Patent Application No. 2006-294620, filed on Oct. 30, 2006, the contents of which are herein incorporated by reference in their entirety.

BACKGROUND OF THE INVENTION

1. Field of the Invention

The present invention relates to a producing method of a wired circuit board. More particularly, the present invention relates to a producing method of a wired circuit board such as a suspension board with circuit.

2. Description of the Related Art

There has been conventionally known a wired circuit board on which an insulating base layer, a conductive pattern having a wire and a terminal portion, and an insulating cover layer are sequentially laminated. The wired circuit boards of this type are widely used in a variety of fields of electric and electronic equipment.

As a producing method of such wired circuit board, in order to prevent electrostatic breakdown of electronic components to be mounted thereon, for example, there has been proposed a producing method of a flexible printed circuit board obtained by producing a laminated body (board body) made of a base layer, a conductor circuit, and a cover layer, and then forming a conductive polymer layer around the laminated body (cf., Japanese Unexamined Patent Publication No. 2004-158480).

SUMMARY OF THE INVENTION

In the producing method of a flexible printed circuit board described in Japanese Unexamined Patent Publication No. 2004-158480, a laminated body is dipped in an oxidizing treatment liquid containing a monomer and an oxidizing-polymerizing agent to form a conductive polymer layer. Therefore, such treatment liquid may dissolve a conductive material for forming a conductive circuit in a terminal portion exposed from a cover layer in the conductive circuit. This may corrode the terminal portion, resulting in discoloration therein.

It is an object of the present invention to provide a producing method of a wired circuit board capable of preventing discoloration of a terminal portion and also efficiently removing static electricity charged on the wired circuit board thus obtained.

The producing method of a wired circuit board according to the present invention comprises the step of preparing a wired circuit board comprising an insulating layer and a conductive pattern having a wire covered with the insulating layer and a terminal portion exposed from the insulating layer; and the step of forming a semiconductive layer on a surface of the insulating layer by dipping the wired circuit board in a polymeric liquid of a conductive polymer with an electrode applying a voltage so that the electrode becomes an anode and the conductive pattern becomes a cathode.

In the producing method of the wired circuit board, the wired circuit board is dipped in the polymeric liquid of the conductive polymer in which an electrode is provided, and a voltage is applied thereto so that the electrode becomes an anode and the conductive pattern becomes a cathode. Therefore, according to the principle of electrolysis, the anode emits electrons while the cathode receives electrons, whereby a conductive material which forms the conductive pattern serving as the cathode becomes less likely to dissolve even if the conductive material is exposed in the terminal portion.

Accordingly, a semiconductive layer can be formed on a surface of the insulating layer while corrosion in the terminal portion can be prevented.

As a result, static electricity charged on the wired circuit board obtained can be efficiently removed while discoloration in the terminal portion can be prevented.

Further, in the producing method of a wired circuit board according to the present invention, it is preferable that in the step of preparing the wired circuit board, a plating layer is formed on a surface of the terminal portion.

In general, in producing methods of a wired circuit board, in order to protect a terminal portion, a plating layer may be formed on a surface thereof. However, when the wired circuit board is dipped in a polymeric liquid of a conductive polymer, the polymeric liquid permeates the interface between a peripheral end portion of the plating layer and an insulating layer. This may dissolve a conductive material in the terminal portion, which may corrode in the terminal portion.

However, in this producing method of a wired circuit board, according to the above-mentioned principle of electrolysis, the conductive material in the terminal portion is less likely to dissolve. Therefore, even if a plating layer is formed on a surface of the terminal portion, and the polymeric liquid of the conductive polymer permeates the interface between a peripheral end portion of the plating layer and an insulating layer, such corrosion may not occur and as a result, discoloration in the terminal portion can be effectively prevented.

In the producing method of a wired circuit board according to the present invention, it is preferable that the conductive material which forms the conductive pattern is copper.

In general, when a conductive material which forms a conductive pattern is copper, the copper is readily dissolved by dipping the copper in the polymeric liquid of the conductive polymer. However, in this producing method of a wired circuit board, according to the above-mentioned principle of electrolysis, the copper that forms the conductive pattern is less likely to dissolve. Therefore, dissolution of the copper may not occur in the terminal portion, and, as a result, discoloration in the terminal portion can be effectively prevented.

In the producing method of a wired circuit board according to the present invention, it is preferable that a voltage of 1.0 V or more is applied.

In this producing method of a wired circuit board, since a 1.0 V or more voltage is applied, the dissolution of the conductive material in the terminal portion is reliably suppressed.

Accordingly, corrosion in the terminal portion can be reliably prevented. As a result, discoloration in the terminal portion can be reliably prevented.

In the producing method of a wired circuit board according to the present invention, it is preferable that the conductive polymer is polyaniline.

In this producing method of a wired circuit board, since the conductive polymer is polyaniline, the wired circuit board obtained can more efficiently remove static electricity charged thereon.

DETAILED DESCRIPTION OF PREFERRED EMBODIMENTS

Figure 1:
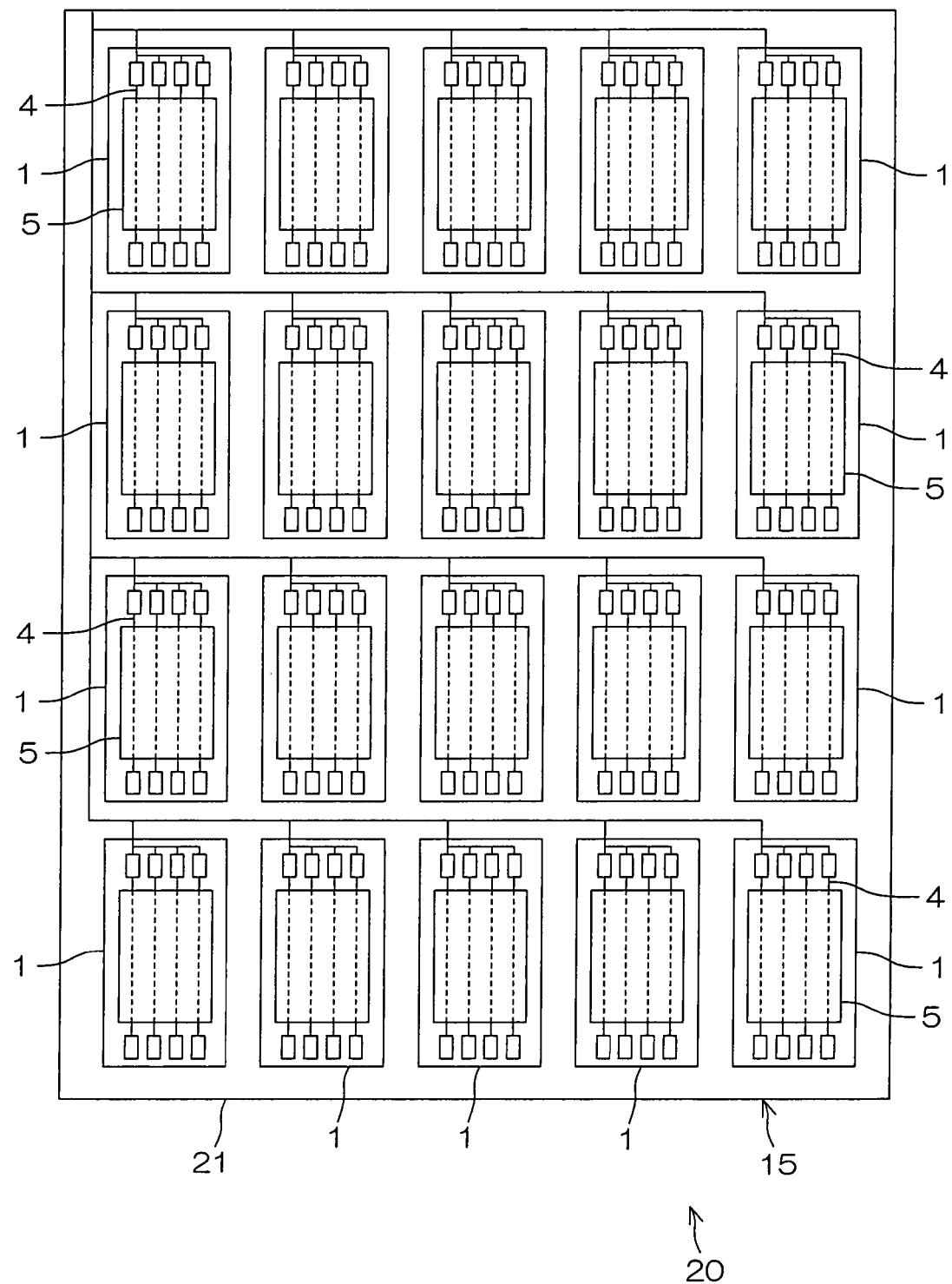
FIG. 1 is a plan view illustrating a suspension-board-with-circuit sheet including a suspension board with circuit as an embodiment of a wired circuit board produced by a producing method of a wired circuit board according to the present invention.
Figure 2:
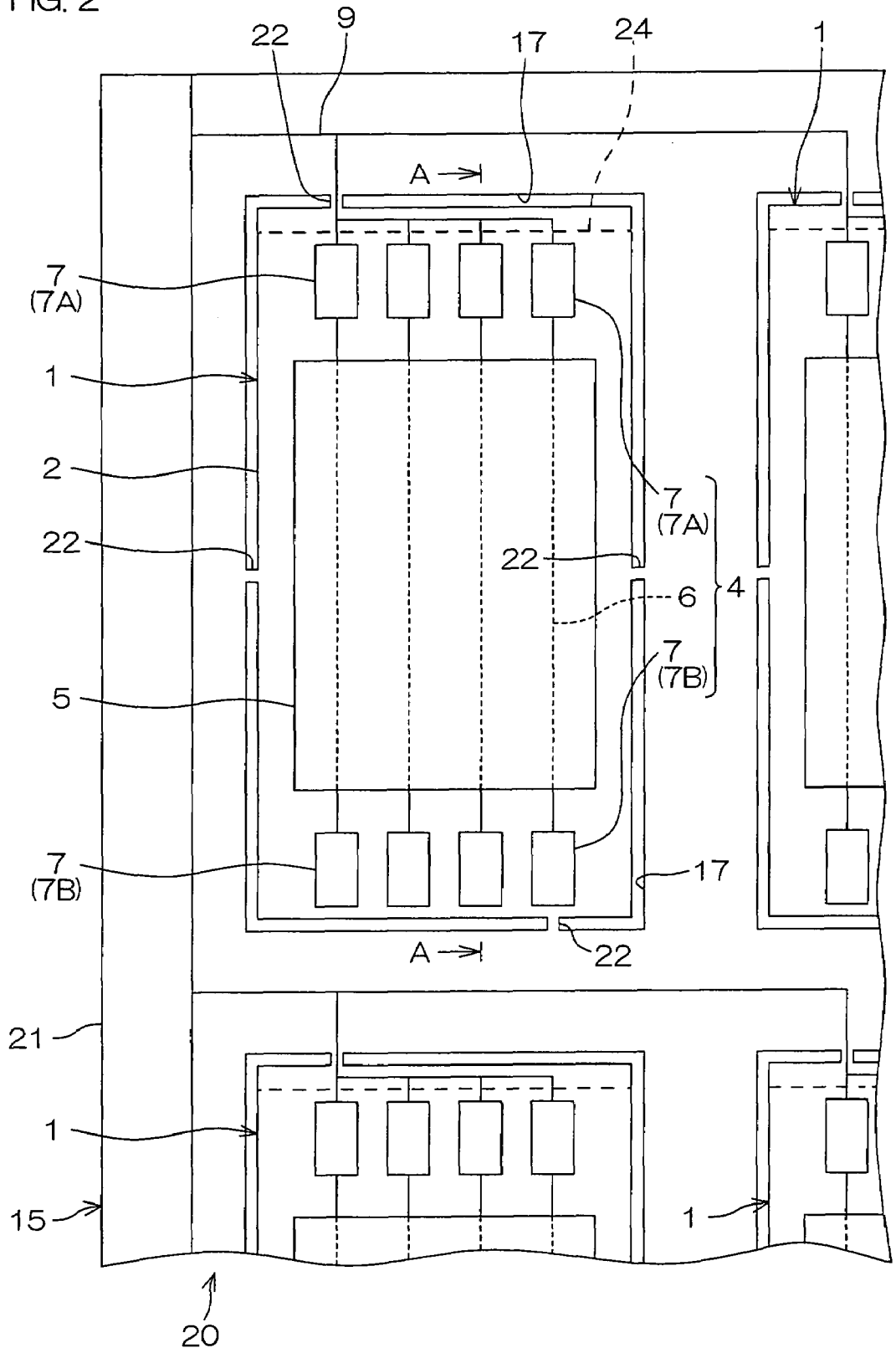
FIG. 2 is an enlarged plan view of the suspension board with circuit shown in FIG. 1.

FIG. 1 is a plan view illustrating a suspension-board-with-circuit sheet including a suspension board with circuit as an embodiment of a wired circuit board produced by a producing method of a wired circuit board according to the present invention, and FIG. 2 is an enlarged plan view of the suspension board with circuit shown in FIG. 1. To clarify the arrangement of a conductive pattern 4 described later, an insulating base layer 3, a plating layer 8 and a semiconductive layer 10, which are mentioned later, are omitted in FIGS. 1 and 2.

In FIG. 1, the suspension-board-with-circuit sheet 20 includes a plurality of suspension boards with circuit 1 and a support frame 21 which separably supports the plurality of suspension boards with circuit 1.

In the support frame 21, each of the suspension boards with circuit 1 is arranged in an aligned state at spaced intervals to each other, and is supported by the support frame 21 via a plurality of joint portions 22 which can be cut, as shown in FIG. 2.

More specifically, a clearance slot 17 for separating each of the suspension boards with circuit 1 from the support frame 21 is formed along the outer peripheral edge of each of the suspension boards with circuit 1 between each of the suspension boards with circuit 1 and the support frame 21. Each joint portion 22 is provided between each of the suspension boards with circuit 1 and the support frame 21 across the clearance slot 17.

The suspension board with circuit 1 includes a metal supporting layer 2 mounted on a hard disk drive. A conductive pattern 4 for connecting a magnetic head (not shown) and a read/write board (not shown) is formed on the metal supporting layer 2. The metal supporting layer 2 supports the magnetic head mounted thereon, while holding a minute gap between the magnetic head and a magnetic disk against an airflow caused when the magnetic head and the magnetic disk travel relatively to each other.

The conductive pattern 4 includes magnetic-head-side connecting terminal portions 7A, external connecting terminal portions 7B, and wires 6 for connecting therebetween, which are formed integrally and continuously.

The wires 6 are provided along a longitudinal direction (hereinafter simply referred to as "lengthwise direction") of the suspension board with circuit 1, and a plurality (four pieces) of the wires 6 are arranged in parallel at spaced intervals to each other in the widthwise direction (the direction orthogonal to the lengthwise direction; the same applies hereinafter).

The magnetic-head-side connecting terminal portions 7A are arranged at a front end portion of the metal supporting layer 2 in parallel at spaced intervals to each other along the widthwise direction, and each formed as an angled land having a generally rectangular shape in plane view extending in the lengthwise direction. The plurality (four pieces) of the magnetic-head-side connecting terminal portions 7A are provided so that the front end portions of the respective wires 6 are connected thereto. Terminal portions (not shown) of the magnetic head are connected to the magnetic-head-side connecting terminal portions 7A.

The external connecting terminal portions 7B are arranged at a rear end portion of the metal supporting layer 2 in parallel at spaced intervals to each other along the widthwise direction, and each formed as an angled land having a generally rectangular shape in plane view extending in the lengthwise direction. The plurality (four pieces) of the external connecting terminal portions 7B are provided so that the rear end portions of the respective wire 6 are connected thereto. Terminal portions (not shown) of the read/write board are connected to the external connecting terminal portions 7B.

A plating lead 9 is connected to the conductive pattern 4.

The plating lead 9 is arranged in a front end portion of the suspension board with circuit 1. More specifically, the plating lead 9 is branched so as to be connected to each magnetic-head-side connecting terminal portion 7A, and is combined into one plating lead 9 near the joint portion 22 arranged in the front end portion of the suspension board with circuit 1. The plating lead 9 thus combined into one lead passes through the joint portion 22 and reaches the support frame 21. The plurality of plating leads 9 corresponding to the plurality of suspension boards with circuit 1 on the support frame 21 are further combined into one plating lead 9 at the end of the support frame 21, and the single plating lead is then connected to a lead wire 14 (cf. FIG. 6), which is mentioned later.

The magnetic-head-side connecting terminal portions 7A and the external connecting terminal portions 7B are hereinafter simply described as "the terminal portion 7", when not particularly necessary to be distinguished.

Figure 3:
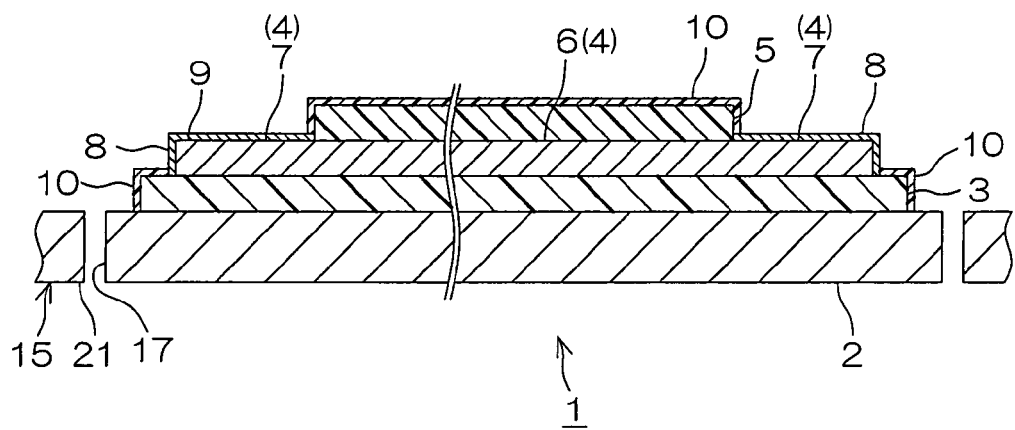
FIG. 3 is a sectional view of the suspension board with circuit taken along the line A-A shown in FIG. 2.

As shown in FIG. 3, the suspension board with circuit 1 includes a metal supporting layer 2, an insulating base layer 3 formed on the metal supporting layer 2, a conductive pattern 4 formed on the insulating base layer 3, and an insulating cover layer 5 formed on the insulating base layer 3 so as to cover the conductive pattern 4. The suspension board with circuit 1 also includes a plating layer 8 formed on a surface of the terminal portion 7 of the conductive pattern 4, and a semiconductive layer 10 formed on the surface of the insulating cover layer 5 and the surface of the insulating base layer 3.

The metal supporting layer 2 is formed in a generally rectangular sheet-like shape in plane view extending along the lengthwise direction as shown in FIG. 2. The metal supporting layer 2 is formed of a metal material, such as stainless steel, 42-alloy, aluminum, copper-beryllium, or phosphor bronze. The metal supporting layer 2 has a thickness in the range of, for example, 15 to 30 μm, or preferably 20 to 25 μm.

As shown in FIG. 1, the insulating base layer 3 is formed on the metal supporting layer 2 so as to have a generally rectangular sheet-like shape in plane view slightly shorter in the lengthwise direction and the widthwise direction (not shown) than the metal supporting layer 2. The insulating base layer 3 is formed of an insulating material such as synthetic resin, for example, polyimide resin, polyamide imide, acrylic, polyether nitrile, polyether sulfone, polyethylene terephthalate, polyethylene naphthalate, or polyvinyl chloride. Preferably, the insulating base layer 3 is formed of polyimide. The insulating base layer 3 has a thickness in the range of, for example, 1 to 35 μm, or preferably 8 to 15 μm. The size of the insulating base layer 3 is appropriately set corresponding to the metal supporting layer 2.

The conductive pattern 4 is formed on the insulating base layer 3 as a wired circuit pattern which is integrally formed of the wires 6 and the terminal portions 7 connected to the wires 6.

The wire 6 is formed so as to be covered with the insulating cover layer 5.

The terminal portion 7 is formed in both lengthwise end portions of the insulating base layer 3 so as to be exposed from both end portions of the insulating cover layer 5.

The conductive pattern 4 is formed of a conductive material, for example, copper, nickel, gold, or alloys thereof. Preferably, the conductive pattern 4 is formed of copper.

The conductive pattern 4 has a thickness in the range of, for example, 3 to 50 μm, or preferably 5 to 20 μm. Each of the wires 6 has a width (length in widthwise direction; the same applies hereinafter) in the range of, for example, 10 to 200 μm, or preferably 20 to 100 μm, and a spacing between each of the wires 6 is in the range of, for example, 10 to 1000 μm, or preferably 20 to 100 μm. Each of the terminal portions 7 has a length in the range of, for example, 50 to 2000 μm, or preferably 100 to 1000 μm, and has a width in the range of, for example, 50 to 2000 μm, or preferably 100 to 1000 μm.

As shown in FIG. 2, the insulating cover layer 5 is formed in a generally rectangular sheet-like shape in plane view extending along the lengthwise direction. More specifically, in the lengthwise direction, the insulating cover layer 5 is arranged so that both lengthwise end edges thereof are slightly shorter than both lengthwise end edges of the insulating base layer 3. In the widthwise direction, the insulating cover layer 5 is arranged so that both widthwise end edges thereof are in the same position as both widthwise end edges (not shown) of the insulating base layer 3 in plane view. Accordingly, the insulating cover layer 5 covers the wires 6 of the conductive pattern 4, and exposes the terminal portions 7 of the conductive pattern 4.

The insulating cover layer 5 is formed of the same insulating material as used for the above-mentioned insulating base layer 3. The insulating cover layer 5 has a thickness in the range of, for example, 1 to 40 μm, or preferably, 1 to 7 μm. The size of the insulating cover layer 5 is appropriately set depending on the size of the insulating base layer 3 and the terminal portion 7.

As shown in FIG. 3, the plating layer 8 is formed on the upper surface, both lengthwise side surfaces, and both widthwise side surfaces (not shown) of the terminal portion 7. The plating layer 8 is also formed on a surface of the plating lead 9. As a material which forms the plating layer 8, for example, a metal material such as gold is used. The plating layer 8 has a thickness in the range of, for example, 0.2 to 3 μm, or preferably 0.5 to 2 μm.

The semiconductive layer 10 is formed on the upper surface, both lengthwise side surfaces, and both widthwise side surfaces of the insulating cover layer 5, and on the upper surface of the insulating base layer 3 exposed from the insulating cover layer 5 and the conductive pattern 4, and both lengthwise side surfaces and both widthwise side surfaces (not shown) of the insulating base layer 3.

The semiconductive layer 10 is formed of a conductive polymer by dipping the semiconductive layer 10 in a polymeric liquid of the conductive polymer described later.

The conductive polymer includes, for example, polyaniline, polypyrrole, polythiophene, or a derivative thereof, or preferably polyaniline. These conductive polymers can be used alone or in combination of two or more kinds.

The semiconductive layer 10 has a thickness in the range of, for example, 5 to 30 nm, or preferably 7 to 20 nm.

Further, as shown in FIG. 2, the plating lead 9 and notches 24 are provided in the suspension board with circuit 1.

The plating lead 9 is formed on the metal supporting layer 2 and the insulating base layer 3. The plating lead 9 is formed of the same conductive material as used for the above-mentioned conductive pattern 4 in the above-mentioned pattern so as to be connected with the conductive pattern 4.

The notches 24 are linearly provided along the widthwise direction across portions where the plating lead 9 is branched into four leads, and is formed in a perforated shape. This allows removal of the portion where the plating lead 9 is combined into one lead.

Figure 4:
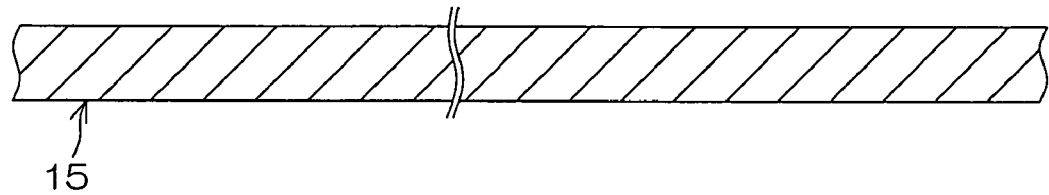
FIG. 4 is a sectional view illustrating the steps of producing the suspension board with circuit shown in FIG. 3, (a) showing the step of preparing a metal supporting board, (b) showing the step of forming an insulating base layer on the metal supporting board, (c) showing the step of forming a conductive pattern and a plating lead, and (d) showing the step of forming an insulating cover layer on the insulating base layer as a pattern which covers a wire and covers a terminal portion.
Figure 4:
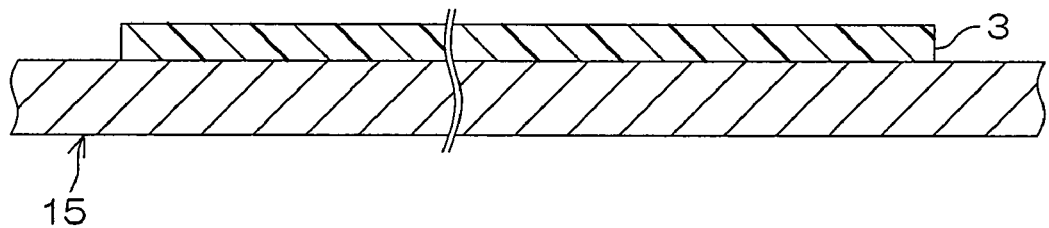
Figure 4:
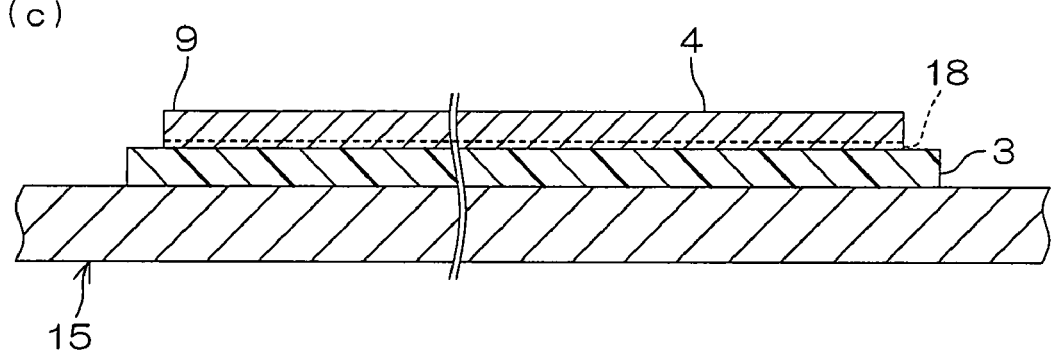
Figure 4:
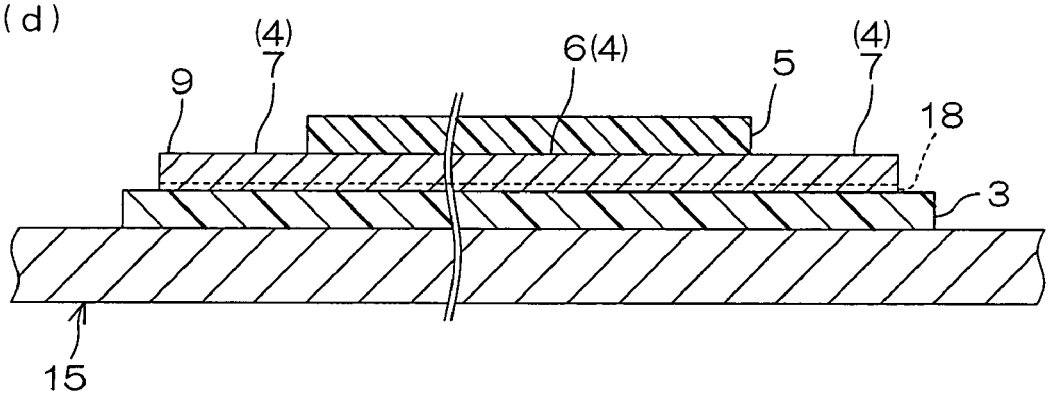
Figure 5:
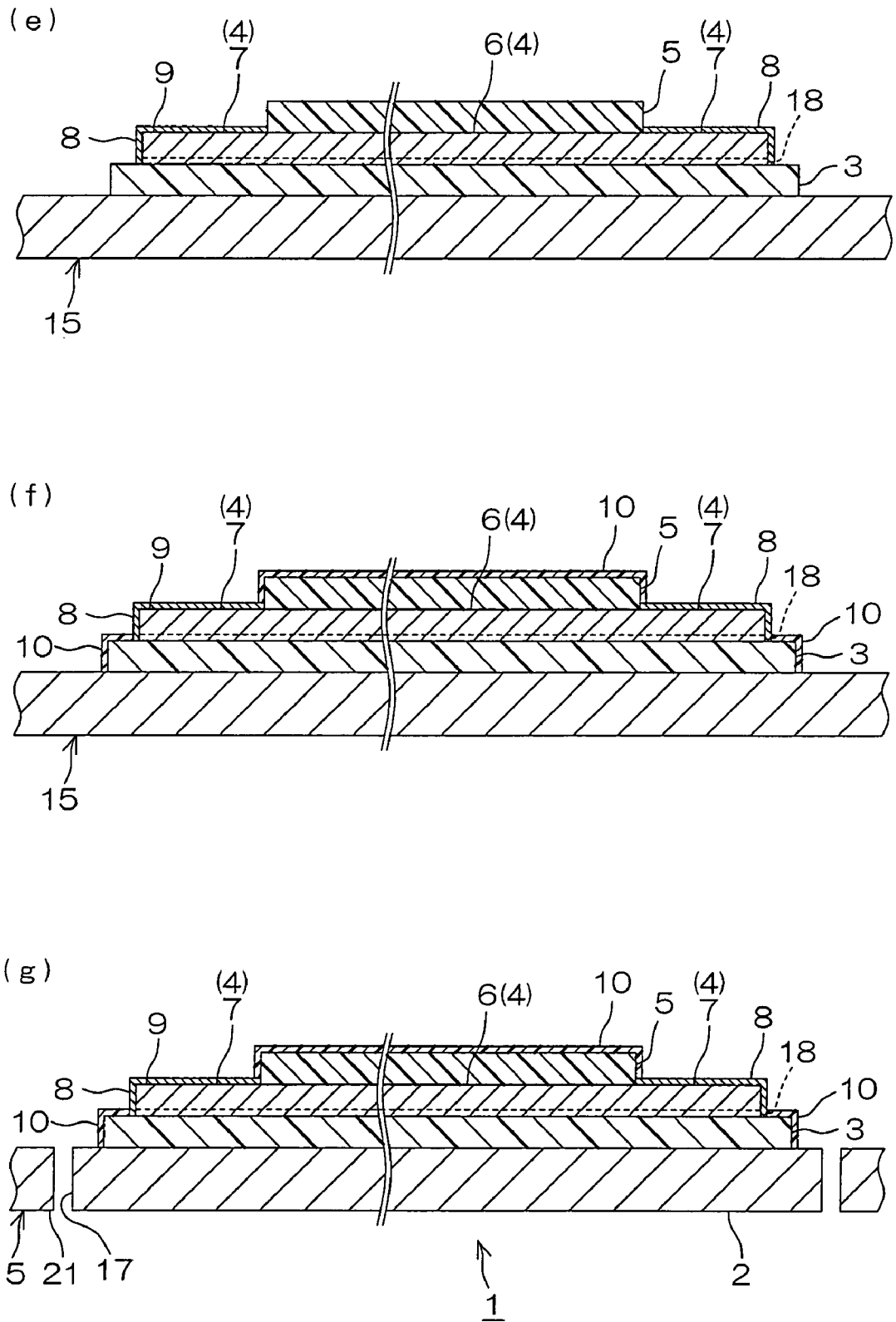
FIG. 5 is a sectional view illustrating the steps, subsequent to FIG. 4, of producing the suspension board with circuit shown in FIG. 3, (e) showing the step of forming a plating layer on surfaces of the terminal portion and the plating lead, (f) showing the step of forming a semiconductive layer on the surface of the insulating cover layer and the surface of the insulating base layer, and (g) showing the step of forming a metal supporting layer by forming a clearance slot.

Next, a producing method of this suspension board with circuit 1 is described with reference to FIGS. 4 to 6.

First, in this method, a metal supporting board 15 is prepared, as shown in FIG. 4(a).

As referred to FIG. 1, the metal supporting board 15 is formed in a generally rectangular sheet-like shape in plane view. As referred to FIG. 2, the metal supporting board 15 includes a metal supporting layer 2 corresponding to each of the suspension boards with circuit 1, and a support frame 21. The same material as used for the metal supporting layer 2 is used as a metal material which forms the metal supporting board 15.

Subsequently, in this method, as shown in FIG. 4(b), an insulating base layer 3 is formed on the metal supporting board 15 as a pattern corresponding to each of the suspension boards with circuit 1.

To form the insulating base layer 3 in the above-mentioned pattern, for example, a varnish of the insulating material described above having photosensitivity is coated over the upper surface of the metal supporting board 15 and then dried. Thereafter, the coated varnish is exposed to light via a photomask, and then developed to be cured as required.

Subsequently, in this method, as shown in FIG. 4(c), a conductive pattern 4 is formed on the insulating base layer 3 as the wired circuit pattern corresponding to each of the suspension boards with circuit 1, and a plating lead 9 is also formed on the insulating base layer 3.

The conductive pattern 4 and the plating lead 9 are formed by a known patterning method, such as an additive method or a subtractive method, although preferably the additive method is used.

In the additive method, first, a metal thin film 18 shown in phantom line is formed on the upper surface, both lengthwise side surfaces, and both widthwise side surfaces of the insulating base layer 3, and on the upper surface of the metal supporting board 15 exposed from the insulating base layer 3.

The metal thin film 18 is formed by laminating a thin chromium film and a thin copper film by sputtering, or preferably chromium sputtering and copper sputtering.

Then, after a plating resist, which is not shown, is formed in a pattern reverse to the above-mentioned pattern on the upper surface of the metal thin film 18, the conductive pattern 4 is formed on the upper surface of the metal thin film 18 exposed from the plating resist in the above-mentioned pattern by electrolytic plating. Thereafter, the plating resist and the metal thin film 18 on which the plating resist is laminated are removed.

Thus, the conductive pattern 4 is formed on the insulating base layer 3 in the wired circuit pattern corresponding to each of the suspension boards with circuit 1, and the plating lead 9 can also be formed on the metal supporting board 15 and the insulating base layer 3.

Subsequently, in this method, as shown in FIG. 4(d), an insulating cover layer 5 is formed on the insulating base layer 3 as a pattern which covers the wires 6 of the conductive pattern 4 and exposes the terminal portions 7 of the conductive pattern 4, corresponding to each of the suspension boards with circuit 1.

To form the insulating cover layer 5 in the above-mentioned pattern, for example, a varnish of the insulating material described above having photosensitivity is coated over the upper surface of the metal supporting board 15 including the conductive pattern 4, the plating lead 9, and the insulating base layer 3, and then dried. Thereafter, the coated varnish is exposed to light via a photomask, and then developed to be cured as required.

Subsequently, in this method, as shown in FIG. 5(e), a plating layer 8 is formed on the surface of the terminal portion 7 and the surface of the plating lead 9, corresponding to each of the suspension boards with circuit 1.

To form the plating layer 8, for example, a plating resist, which is not shown, is formed so as to cover the metal supporting board 15 except the plating lead 9, and thereafter, for example, the plating resist thus formed by electrolytic plating or electroless plating, or preferably electrolytic gold plating or electroless gold plating. Thereafter, the plating resist is removed.

Thus, a plurality of suspension boards with circuit 1 in process (suspension boards with circuit 1 before the semiconductive layer 10 is formed) including the insulating base layer 3 and the insulating cover layer 5, and the conductive pattern 4 are prepared on the metal supporting board 15.

In the plurality of suspension boards with circuit 1 in process, the conductive pattern 4 integrally includes the wires 6 covered with the insulating cover layer 5, and the terminal portions 7 exposed from the insulating cover layer 5 and having the plating layer 8 formed on the surfaces thereof. Further, in the plurality of suspension boards with circuit 1 in process, the conductive pattern 4 is connected to the plating lead 9 (cf. FIG. 2).

Subsequently, in this method, as shown in FIG. 5(f), a semiconductive layer 10 is formed on the surface of the insulating cover layer 5 and the surface of the insulating base layer 3, corresponding to each of the suspension boards with circuit 1.

Figure 6:
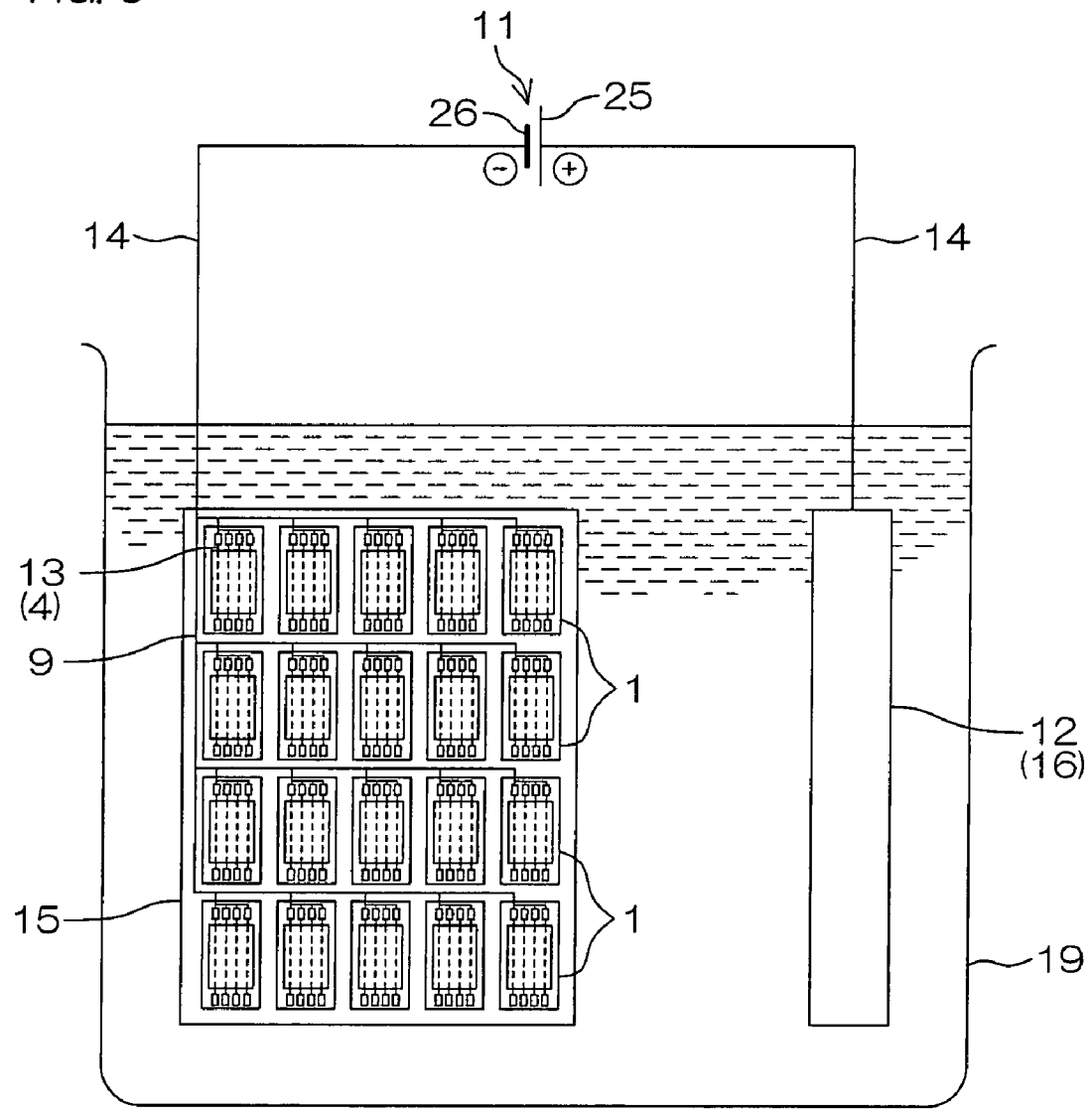
FIG. 6 is a schematic view for explaining the step of forming the semiconductive layer shown in FIG. 5 (f).

To form the semiconductive layer 10, first, the metal supporting board 15 after completion of the step in FIG. 5(e) is dipped in the polymeric liquid of a conductive polymer in which an electrode 16 is provided as shown in FIG. 6, and a voltage is applied thereto so that the conductive pattern 4 serves as a cathode 13.

Such polymeric liquid of the conductive polymer is prepared, for example, by mixing a monomer and a solvent for polymerizing the conductive polymer.

The monomer that may be used includes, for example, aniline, pyrrole, and thiophene, or preferably aniline is used. These monomers can be used alone or in combination of two or more kinds.

The solvent that may be used includes, for example, water, and an acidic aqueous solution, although preferably the acidic aqueous solution is used. An acid component that may be used to form the acidic aqueous solution includes an inorganic acid, for example, hydrochloric acid, nitric acid, sulfuric acid, or phosphoric acid, or an organic acid, for example, formic acid, acetic acid, or oxalic acid.

The concentration of monomers in the polymeric liquid of the conductive polymer is in the range of, for example, 0.005 to 0.5 mol/L, or preferably 0.01 to 0.1 mol/L. In a case where the solvent is an acidic aqueous solution, the concentration of acidic components is in the range of, for example, 0.002 to 0.1 mol/L, or preferably 0.005 to 0.05 mol/L.

The polymeric liquid of the conductive polymer is poured into a polymerization tank 19.

An electrode 16, which becomes an anode 12 by application of a voltage from a direct current power source 11, is inserted in the polymerization tank 19 so as to be dipped in the polymeric liquid of the conductive polymer, and is opposed at a spaced interval to the metal supporting board 15 (suspension-board-with-circuit sheet 20 in process). The electrode 16 is of a flat plate and is formed of, for example, a metal material such as platinum. The electrode 16 can be formed of, for example, a cylindrical electrode.

The metal supporting board 15 is inserted into the polymerization tank 19 so as to be dipped in the polymeric liquid of the conductive polymer.

Subsequently, the electrode 16 is connected to an anode-side terminal 25 of the direct current power source 11 through a lead wire 14, and the plating lead 9 is also connected to a cathode-side terminal 26 of the direct current power source 11 through the lead wire 14. Then, when a voltage is applied by the direct current power source 11, the electrode 16 becomes the anode 12 and the conductive pattern 4 becomes a cathode 13.

For the application of voltage by the direct current power source 11, the voltage is set to, for example, 1.0 V or more, preferably 1.5 V or more, or more preferably 2.0 V or more, and usually 3.0 V or less.

Subsequently, a polymerization initiator is mixed with the polymeric liquid of the conductive polymer described above.

The polymerization initiator that may be used includes: for example, an azo initiator such as 2,2'-azobisisobutyronitril, 2,2'-azobis(2-methylpropioneamidine) disulfate, or 2,2'-azobis(2-methylpropioneamidine) dihydrochloride; a persulfate initiator such as potassium persulfate (potassium peroxodisulfate) or ammonium persulfate (ammonium peroxodisulfate); a peroxide initiator such as benzoyl peroxide, t-butyl hydroperoxide, or hydrogen peroxide; a substituted ethane initiator such as phenyl substituted ethane; a carbonyl initiator such as an aromatic carbonyl compound; and a redox initiator such as a combination of persulfate and sodium hydrogensulfite or a combination of peroxide and sodium ascorbate. These polymerization initiators can be used alone or in combination of two or more kinds.

To mix a polymerization initiator with the polymeric liquid of the conductive polymer, a polymerization initiator solution obtained by dissolving a polymerization initiator in a solvent is prepared as required, and the polymerization initiator solution thus obtained may also be mixed. As the solvent used for preparation of the polymerization initiator solution, the same solvent as that used for preparation of the polymeric liquid is used.

When the polymerization initiator (or polymerization initiator solution) is mixed with the polymeric liquid, the concentration of the polymerization initiator in the polymeric liquid is in the range of, for example, 0.002 to 0.2 mol/L, or preferably 0.005 to 0.1 mol/L.

After the polymerization initiator is mixed, while the application of the voltage is continued, the conductive polymer is polymerized and deposited on the surface of the insulating base layer 3 and the surface of the insulating cover layer 5 in each of the suspension boards with circuit 1 for 5 to 180 minutes, or preferably for 10 to 100 minutes.

In the above-mentioned dipping, the dipping temperature of the polymeric liquid of the conductive polymer is set in the range of, for example, 1 to 40° C., or preferably 5 to 25° C.

Accordingly, in each of the suspension boards with circuit 1, the semiconductive layer 10 made of the conductive polymer is polymerized and formed so as to be deposited on a surface of an insulating layer, that is, the surface of the insulating cover layer 5 and the surface of the insulating base layer 3.

Thereafter, the metal supporting board 15 is withdrawn from the polymerization tank 19, and then washed with water.

Subsequently, in this method, the conductive polymer of the semiconductive layer 10 is doped as required.

To dope the conductive polymer of the semiconductive layer 10, the metal supporting board 15 (the plurality of suspension boards with circuit 1 in which the semiconductive layer 10 is formed) is dipped in a solution in which the doping agent is dissolved (doping agent solution).

The doping agent imparts conductivity to the conductive polymer, and the doping agent that may be used includes, for example, p-toluenesulfonic acid, dodecylbenzenesulfonic acid, alkylnaphthalenesulfonic acid, polystyrenesulfonic acid, p-toluenesulfonic acid novolac resin, p-phenolsulfonic acid novolac resin, and β-naphthalenesulfonic acid-formalin condensate. These doping agents can be used alone or in combination of two or more kinds.

For example, water or methanol is used as a solvent for dissolving the doping agent.

In preparation of the doping agent solution, the solvent is mixed so that the concentration of the doping agent is in the range of, for example, 5 to 100% by weight, or preferably 10 to 50% by weight.

The dipping time of the metal supporting board 15 in the doping agent solution is set in the range of, for example, 30 seconds to 30 minutes, or preferably 1 to 10 minutes.

The dipping (doping) temperature of the doping agent solution is set in the range of, for example, 10 to 70° C., or preferably 20 to 60° C.

Doping of the above-mentioned semiconductive layer 10 with the conductive polymer imparts conductivity to the conductive polymer.

The surface resistance value of the semiconductive layer 10 doped with the conductive polymer is in the range of, for example, $1 \times 10^5$ to $1 \times 10^{12} \Omega/\square$, or preferably $1 \times 10^6$ to $1 \times 10^{11} \Omega/\square$. The surface resistance value of the semiconductive layer 10 can be measured, for example, using Hiresta IP MCP-HT260 (probe: HRS) available from Mitsubishi Petrochemical Co., Ltd.

Thereafter, in this method, the metal supporting board 15 (the plurality of suspension boards with circuit 1 in which the semiconductive layer 10 doped with the conductive polymer is formed) is further washed with water.

Subsequently, in this method, as shown in FIG. 5(g), a clearance slot 17 is formed in the metal supporting board 15 by chemical etching, etc., thereby forming the metal supporting layer 2 supported by the support frame 21 through the joint portion 22 to obtain the plurality of suspension boards with circuit 1.

Thereafter, in each of the suspension boards with circuit 1, as referred to FIG. 2, the joint portion 22 is cut off, and a continuity test is then performed on the conductive pattern 4. Thereafter, the plating lead 9 is torn off along with notches 24.

In the producing method of the suspension board with circuit 1, the metal supporting board 15 (the plurality of suspension boards with circuit 1 in process) is dipped in the polymeric liquid of the conductive polymer in which the electrode 16 is provided, and a voltage is applied thereto by the direct current power source 11 so that the electrode 16 becomes the anode 12 and the conductive pattern 4 becomes the cathode 13. Therefore, according to the principle of electrolysis, the anode 12 supplies electrons to the direct current power source 11 while the cathode 13 receives electrons, whereby a conductive material which forms the conductive pattern 4 serving as the cathode 13 is less likely to be dissolved in the polymeric liquid of the conductive polymer even if the conductive material is exposed in the terminal portion 7.

Accordingly, the semiconductive layer 10 can be formed on the surface of the insulating cover layer 5 and the surface of the insulating base layer 3 while corrosion in the terminal portion 7 can be prevented.

As a result, static electricity charged on the suspension board with circuit 1 obtained can be efficiently removed while discoloration in the terminal portion 7 can be prevented.

In the producing method of the suspension board with circuit 1, in order to protect the terminal portion 7, the plating layer 8 is formed on the surface thereof. However, when the suspension board with circuit 1 is dipped in the polymeric liquid of the conductive polymer, the polymeric liquid permeates the interface between the peripheral end portion of the plating layer 8, and the insulating cover layer 5 and the insulating base layer 3, which may cause corrosion in the terminal portion 7. However, in this method, according to the above-mentioned principle of electrolysis based on the application of voltage, the conductive material in the terminal portion 7 is less likely to be dissolved. Therefore, such corrosion may not occur, and, as a result, discoloration in the terminal portion 7 can be effectively prevented.

In the suspension board with circuit 1 in process, in the case where the conductive material of the conductive pattern 4 is copper, the copper is easy to dissolve by dipping the copper in the polymeric liquid of the conductive polymer. However, according to the above-mentioned principle of electrolysis, the copper for forming the conductive pattern 4 is less likely to be dissolved.

Therefore, the copper corrosion in the terminal portion 7 may not occur, and, as a result, discoloration in the terminal portion 7 can be effectively prevented.

In the application of voltage by the direct current power source 11 during the formation of the semiconductive layer 10, in the case where a voltage of 1.0 V or more is applied, the dissolution of the conductive material in the terminal portion 7 is reliably suppressed.

Accordingly, the corrosion in the terminal portion 7 can be reliably prevented. As a result, the discoloration in the terminal portion 7 can be reliably prevented.

In the producing method of the suspension board with circuit 1, in the case where the conductive polymer is polyaniline, the suspension board with circuit 1 obtained can more efficiently remove static electricity charged thereon.

Accordingly, the corrosion in the terminal portion 7 can be reliably prevented. As a result, the discoloration in the terminal portion 7 can be reliably prevented.

In the above explanation, the wired circuit board of the present invention has been illustrated and described with the suspension boards with circuit 1. However, the wired circuit board of the present invention is not limited thereto, and can be widely applied to other wired circuit boards, such as a single-sided flexible wired circuit board, a double-sided flexible wired circuit board, or a multi-layered flexible wired circuit board, or further various flexible wired circuit boards having the metal supporting layer 2 provided as a reinforcing layer.

EXAMPLES

While in the following, the present invention is described in further detail with reference to Examples and Comparative Example, the present invention is not limited to any of them by no means.

(Production of Suspension Board with Circuit)

Example 1

A metal supporting board made of a 20 μm thick stainless steel was prepared (cf. FIG. 4(a)).

Subsequently, a varnish of photosensitive polyamic acid resin was uniformly coated over an upper surface of the metal supporting board using a spin coater. The coated varnish was then heated at 90° C. for 15 minutes to form a base coating. Thereafter, the base coating was exposed to light at 700 mJ/cm$^2$ via a photomask, and then heated at 190° C. for 10 minutes. The base coating thus heated was then developed using an alkaline developer. Subsequently, the coating was cured at 385° C. under the pressure reduced to 1.33 Pa, thereby forming an insulating base layer of polyimide on the metal supporting board in a pattern corresponding to each suspension board with circuit (cf. FIG. 4(b)). The insulating base layer thus formed had a thickness of 10 μm.

Next, by an additive method, a conductive pattern made of a 15 μm thick copper was formed in the pattern corresponding to each of the suspension boards with circuit and a plating lead having a thickness of 15 μm was also formed (cf. FIG. 4(c)). Each of the spacing between the wires was 30 μm, and each of the wires had a width of 30 μm. Each of the terminal portions had a length of 200 μm and a width of 200 μm.

Next, the varnish of the photosensitive polyamic acid resin described above was uniformly coated over the upper surface of the metal supporting board including the conductive pattern, the plating lead, and the insulating base layer using a spin coater. The coated varnish was then heated at 90° C. for 10 minutes to form a cover coating having a thickness of 15 μm. Thereafter, the cover coating was exposed to light at 700 mJ/cm$^2$ via a photomask, and then heated at 180° C. for 10 minutes. The cover coating thus heated was then developed using an alkaline developer to pattern the cover coating. Subsequently, the coating was cured at 385° C. under the pressure reduced to 1.33 Pa. As a result of this, an insulating cover layer of polyimide was formed on the insulating base layer in a pattern which covers the wires and exposes the terminal portions, corresponding to each of the suspension boards with circuit (cf. FIG. 4(d)). The insulating cover layer had a thickness of 4 μm.

Next, after a plating resist was formed on the metal supporting board except the plating lead, a gold plating layer was formed on the surface of the terminal portion, corresponding to each of the suspension boards with circuit, by electroless gold plating, and also formed on the surface of the plating lead thereby. Thereafter, the plating resist was removed (cf. FIG. 5(e)). The gold plating layer thus formed had a thickness of 2.5 μm.

Next, a semiconductive layer was formed on the surface of the insulating cover layer and the surface of the insulating base layer, corresponding to each of the suspension boards with circuit (cf. FIG. 5(f)).

To form the semiconductive layer, first, about 300 g of pure water and 2.5 g of aniline were sequentially added to 2.0 g of 98% concentrated sulfuric acid, and the mixture was cooled to 10° C. with stirring to prepare a polymeric liquid of polyaniline. Separately, 20 g of pure water was added to 10.7 g of ammonium peroxodisulfate (ammonium persulfate: APS), and the mixture was stirred until dissolved. The dissolved mixture was cooled to 10° C. to prepare a polymerization initiator aqueous solution.

Then, a polymerization tank in which a platinum electrode was inserted was prepared, and the polymeric liquid of polyaniline described above was poured into the polymerization tank. The metal supporting board (the plurality of suspension boards with circuit in process) was then inserted in the polymerization tank so as to be opposed at a spaced interval to the platinum electrode, and the metal supporting board was dipped in the polymeric liquid. Subsequently, the platinum electrode was connected to an anode side terminal of a direct current power source through a lead wire, while the plating lead was connected to a cathode side terminal of the direct current power source through a lead wire.

Subsequently, a voltage of 1.0 V was applied by the direct current power source so that the platinum electrode became an anode and the conductive pattern became a cathode (cf. FIG. 6). While the application of the voltage was continued, the above-mentioned polymerization initiator aqueous solution was then added to the polymeric liquid of polyaniline and mixed. Thereafter, the metal supporting board was further dipped in the mixture at 10° C. for 12 minutes to polymerize aniline, so that polyaniline was deposited on the surface of the insulating base layer and the surface of the insulating cover layer.

In the polymeric liquid to which the polymerization initiator aqueous solution was added, the concentration of aniline was 0.05 mol/L, the concentration of sulfuric acid was 0.04 mol/L, and the concentration of ammonium peroxodisulfate was 0.09 mol/L.

Then, the metal supporting board was withdrawn from the polymeric liquid in the polymerization tank and then washed with water. Thereafter, the metal supporting board was dipped in a doping agent aqueous solution containing a 20% by weight concentration of p-phenolsulfonic acid novolac resin (PPSA) at 60° C. for 10 minutes to dope the semiconductive layer with polyaniline. Subsequently, the doped semiconductive layer was washed with water. The doped semiconductive layer made of polyaniline had a thickness of 0.03 μm, and also had a surface resistance value in the range of $1 \times 10^7$ to $1 \times 10^8 \Omega/\square$.

Thereafter, a clearance slot was formed in the metal supporting board by chemical etching, thereby forming a metal supporting layer supported by a support frame through a joint portion to obtain a plurality of suspension boards with circuit (cf. FIGS. 2 and 5(g)).

Example 2

The plurality of suspension boards with circuit were obtained in the same method as in Example 1 except that the voltage applied was changed from 1.0 V to 1.5 V in Example 1.

Example 3

The plurality of suspension boards with circuit were obtained in the same method as in Example 1 except that the voltage applied was changed from 1.0 V to 2.0 V in Example 1.

Comparative Example 1

The plurality of suspension boards with circuit were obtained in the same method as in Example 1 except that no voltage was applied, that is, the voltage applied was changed to 0 V in Example 1.

(Evaluation)

The terminal portions in the plurality of suspension boards with circuit obtained in Examples 1 to 3 and Comparative Example 1 were visually observed.

No discoloration was observed on the terminal portions in the suspension boards with circuit of Examples 1 to 3.

However, discoloration was observed on the terminal portion in the suspension board with circuit of Comparative Example 1.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method of producing a wired circuit board comprising:
   preparing a wired circuit board comprising an insulating layer and a conductive pattern having a wire covered with the insulating layer and a terminal portion exposed from the insulating layer; and
   forming a semiconductive layer on a surface of the insulating layer by dipping the wired circuit board in a polymeric liquid of a conductive polymer with an electrode applying a voltage so that the electrode becomes an anode and the conductive pattern becomes a cathode.

2. The method of producing a wired circuit board according to claim 1, wherein, in preparing the wired circuit board, a plating layer is formed on a surface of the terminal portion.

3. The method of producing a wired circuit board according to claim 1, wherein a conductive material which forms the conductive pattern is copper.

4. The method of producing a wired circuit board according to claim 1, wherein a voltage of 1.0 V or more is applied.

5. The method of producing a wired circuit board according to claim 1, wherein the conductive polymer is polyaniline.

* * * * *